United States Patent
Tai et al.

(10) Patent No.: US 8,027,130 B2
(45) Date of Patent: Sep. 27, 2011

(54) FAN SYSTEM AND POWER REVERSE PROTECTION APPARATUS THEREOF

(75) Inventors: Wei-Long Tai, Taoyuan Hsien (TW); Chien-Hua Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 281 days.

(21) Appl. No.: 12/256,905

(22) Filed: Oct. 23, 2008

(65) Prior Publication Data
US 2010/0046132 A1 Feb. 25, 2010

(30) Foreign Application Priority Data
Aug. 20, 2008 (TW) .............................. 97131666 A

(51) Int. Cl.
*H02H 7/00* (2006.01)
(52) U.S. Cl. .......... 361/18; 361/33; 361/91.1; 361/91.2; 361/91.5; 361/91.6; 307/127; 323/278
(58) Field of Classification Search ................ 361/18, 361/33, 86, 100, 101, 77, 91.1, 91.2, 91.5, 361/91.6; 307/127, 138; 323/278, 276, 231
See application file for complete search history.

(56) References Cited

U.S. PATENT DOCUMENTS

| | | | | |
|---|---|---|---|---|
| 3,214,668 A * | 10/1965 | Brinster | ................... | 388/833 |
| 3,740,637 A * | 6/1973 | Iwaki et al. | .................. | 322/28 |
| 4,180,768 A * | 12/1979 | Ferraro | .................. | 323/278 |
| 4,218,647 A * | 8/1980 | Haas | .................. | 323/268 |
| 5,410,441 A * | 4/1995 | Allman | .................. | 361/18 |
| 5,517,379 A * | 5/1996 | Williams et al. | ................ | 361/84 |
| 5,519,557 A * | 5/1996 | Kopera et al. | .................. | 361/84 |
| 6,707,654 B2 * | 3/2004 | Ito et al. | .................. | 361/58 |
| 6,856,495 B2 * | 2/2005 | Ely | .................. | 361/18 |
| 7,619,535 B2 * | 11/2009 | Chen et al. | .................. | 340/635 |

* cited by examiner

*Primary Examiner* — Patrick Salce
(74) *Attorney, Agent, or Firm* — Muncy, Geissler, Olds & Lowe, PLLC

(57) ABSTRACT

A fan system is electrically connected to a power source, and the fan system includes a power reverse protection apparatus, a voltage regulator, a driver, and a fan. The power reverse protection apparatus, electrically connected to the power source, includes a voltage regulator switch and an activating device. The voltage regulator switch receives an input signal and outputs a first output signal according to the input signal. The activating device is electrically connected to the power source and the voltage regulator switch for receiving the input signal and the first output signal, respectively. The activating device outputs a second output signal to the fan according to the first output signal. The voltage regulator is electrically connected to the power source for receiving the input signal from the power source and outputting a regulating signal according to the input signal. The driver is electrically connected to the voltage regulator for receiving the regulating signal and outputting a driving signal according to the regulating signal. The fan is electrically connected with the driver and the power reverse protection apparatus and operates according to the driving signal and the second output signal.

17 Claims, 5 Drawing Sheets

FAN SYSTEM AND POWER REVERSE PROTECTION APPARATUS THEREOF

CROSS REFERENCE TO RELATED APPLICATIONS

This Non-provisional application claims priority under 35 U.S.C. §119(a) on Patent Application No(s). 097131666, filed in Taiwan, Republic of China on Aug. 20, 2008, the entire contents of which are hereby incorporated by reference.

BACKGROUND OF THE INVENTION

1. Field of Invention

The present invention relates to a fan system, in particular to a fan system and a power reverse protection apparatus thereof that can prevent the reverse transmission of the power signal.

2. Related Art

As the high development of technology, the demand to the function of the electronic device is higher, the number and the density of the electronic elements increase, and hence relatively larger amount of the electricity is used. When the amount of the electricity is large, a protective circuit is usually disposed at the input of the electronic device for protection. The efficiency of the protective circuit has a direct effect on the reliability and the lifetime of the electronic device.

A power reverse protection apparatus disposed at the input of the electronic device is usually used to turn on the main power circuit in the electronic device and to turn off the rest of the power circuits. However, the amount of electricity is also consumed while driving the power reverse protection apparatus. Therefore it is an important subject to reduce the power consumption of the power reverse protection apparatus.

Referring to FIG. 1, as disclosed in U.S. Pat. No. 6,611, 410, the conventional power reverse protection apparatus 10 includes an N-type metal oxide semiconductor field effect transistor (N-type MOSFET) 102, which includes a body diode transistor BD1, a plurality of coils (can be regarded as inductors) L1 to LN, a plurality of diodes D1 to DN, a plurality of switches S1 to SN, a capacitor 16, and a capacitor 108. Since the inductor is an energy storage element, as the voltage supply VSUPPLY provides a surge voltage that passes through the body diode BD1, a current is generated and flows to the coils (the inductors) L1 to LN. As the current increases, the coils L1 to LN impede the current increase and temporally store the electric energy in the form of magnetic field, and a high voltage at the two ends of the capacitor 16 thus will be generated. This high voltage will turn on and drive the N-type MOSFET 102 and activate the power reverse protection apparatus 10. If the power reverses instantly, which means, when the voltage supply VSUPPLY is a low potential or a negative potential, the body diode BD1 can be used as a power reverse protection diode and the N-type MOSFET 102 is turned off. However, if a plurality of coils L1 to LN are used to store the energy to drive the N-type MOSFET 102, the coils will take a lot of space and the cost of the coil material is high. The circuit will be more complex and it is harder to control. In addition, driving the capacitor 16 by a high voltage consumes too much power.

SUMMARY OF THE INVENTION

In view of the foregoing, the present invention is to provide a fan system and a power reverse protection apparatus thereof with low power consumption, low cost, small size, and easy to control.

To achieve the above, the present invention provides a power reverse protection apparatus that is electrically connected to a fan and a power source. The power source is electrically connected to a voltage regulator, the voltage regulator is electrically connected to a driver, the driver is electrically connected to the fan, and an input signal generated by the power source is converted to a driving signal by the voltage regulator and the driver. The power reverse protection apparatus includes a voltage regulator switch and an activating device. The voltage regulator switch receives an input signal from the power source and outputs a first output signal according to the input signal. The activating device is electrically connected to the voltage regulator switch and receives the input signal and the first output signal, respectively. The activating device outputs a second output signal to the fan according to the first output signal. The fan is driven and operated according to a driving signal and the second output signal.

To achieve the above, the present invention further provides a fan system that includes a power reverse protection apparatus, a voltage regulator, a driver, and a fan. The power reverse protection apparatus is electrically connected to the power source and includes a voltage regulator switch and an activating device. The voltage regulator switch receives an input signal from the power source and outputs a first output signal according to the input signal. The activating device is electrically connected to the power source and the voltage regulator switch and receives the input signal and the first output signal respectively. The activating device can output a second output signal to the fan according to the first output signal. The voltage regulator is electrically connected to the power source, receives the input signal from the power source, and outputs a regulating signal according to the input signal. The driver is electrically connected to the voltage regulator for receiving the regulating signal and outputting a driving signal according to the regulating signal. The fan is electrically connected to the driver and the power reverse protection apparatus, respectively, receives the driving signal and the second output signal separately, and the fan operates according to the driving signal and the second output signal.

As described above, the fan system of the present invention drives a fan according to a driving signal generated by a driver and a second output signal generated by a power reverse protection apparatus. For one thing, the power reverse protection apparatus has the advantages of low power consumption and low material cost, and it can be easily controlled. Moreover, since the power reverse protection apparatus includes only a few of electronic elements, it can be minimized, which fits the trend of the environmental protection and power saving.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
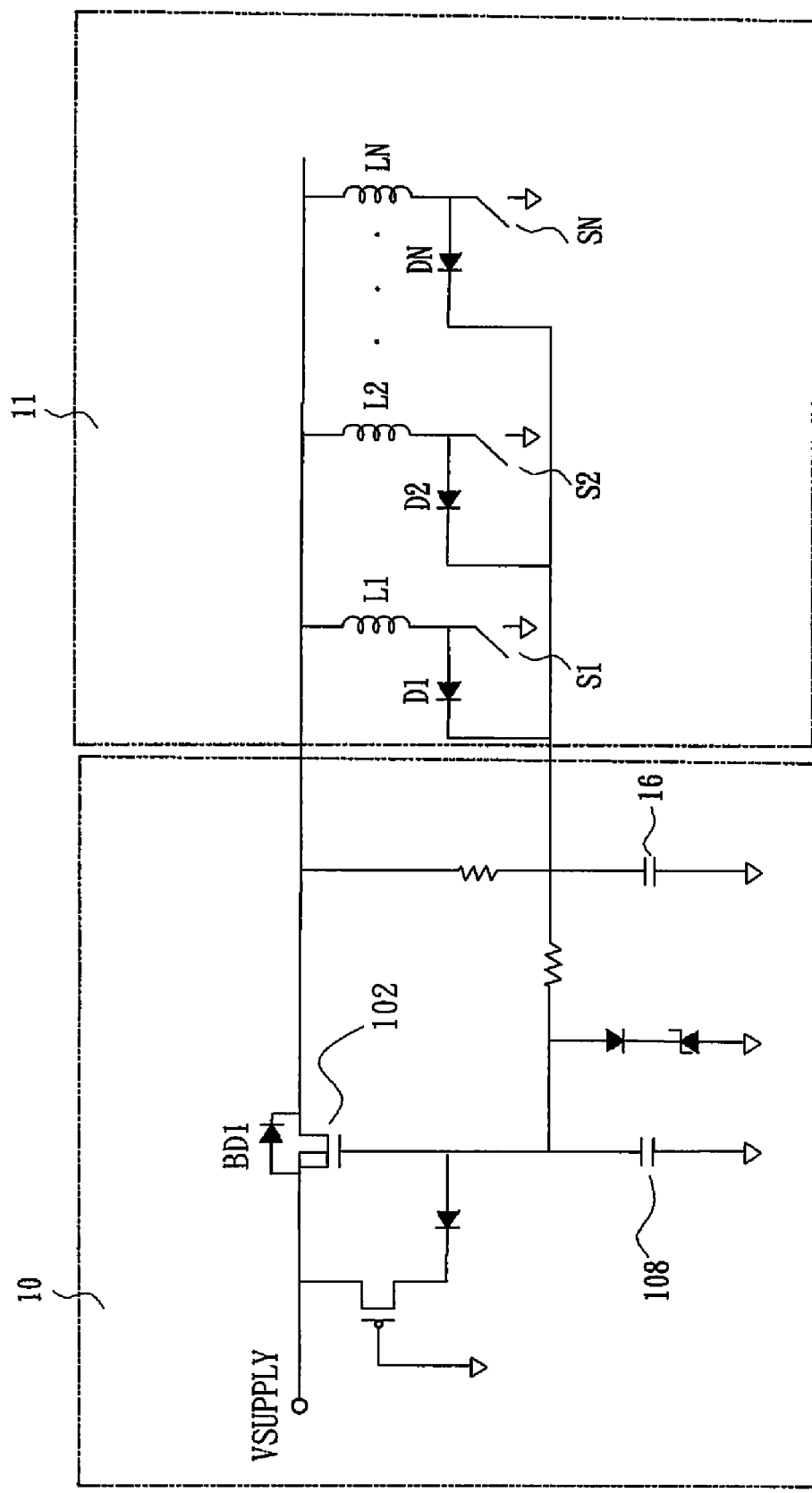
FIG. 1 is a circuit diagram of a conventional power reverse protection apparatus.
Figure 2:
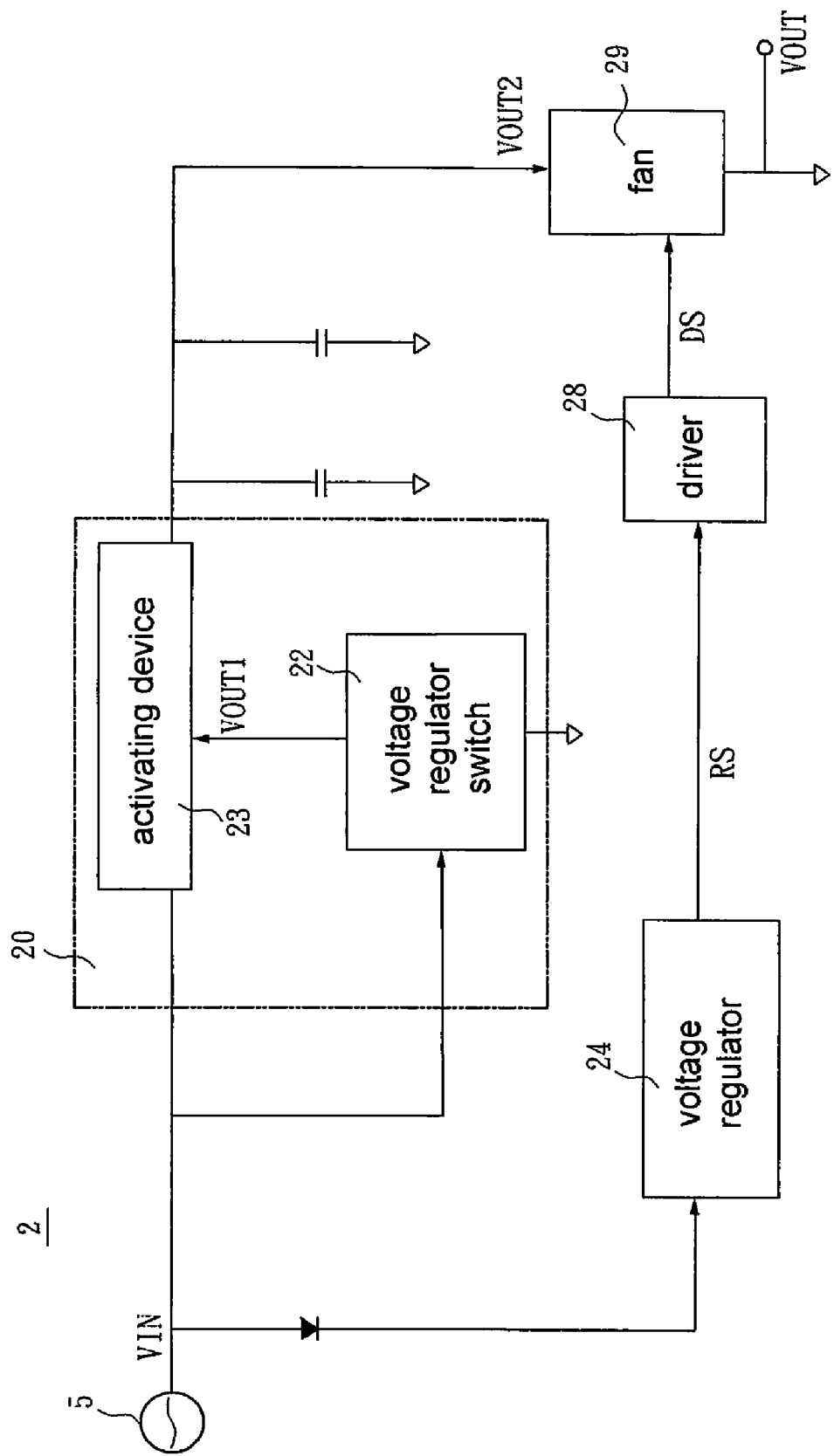
FIG. 2 is a circuit block diagram of a fan system according to a first embodiment of the present invention.
Figure 3:
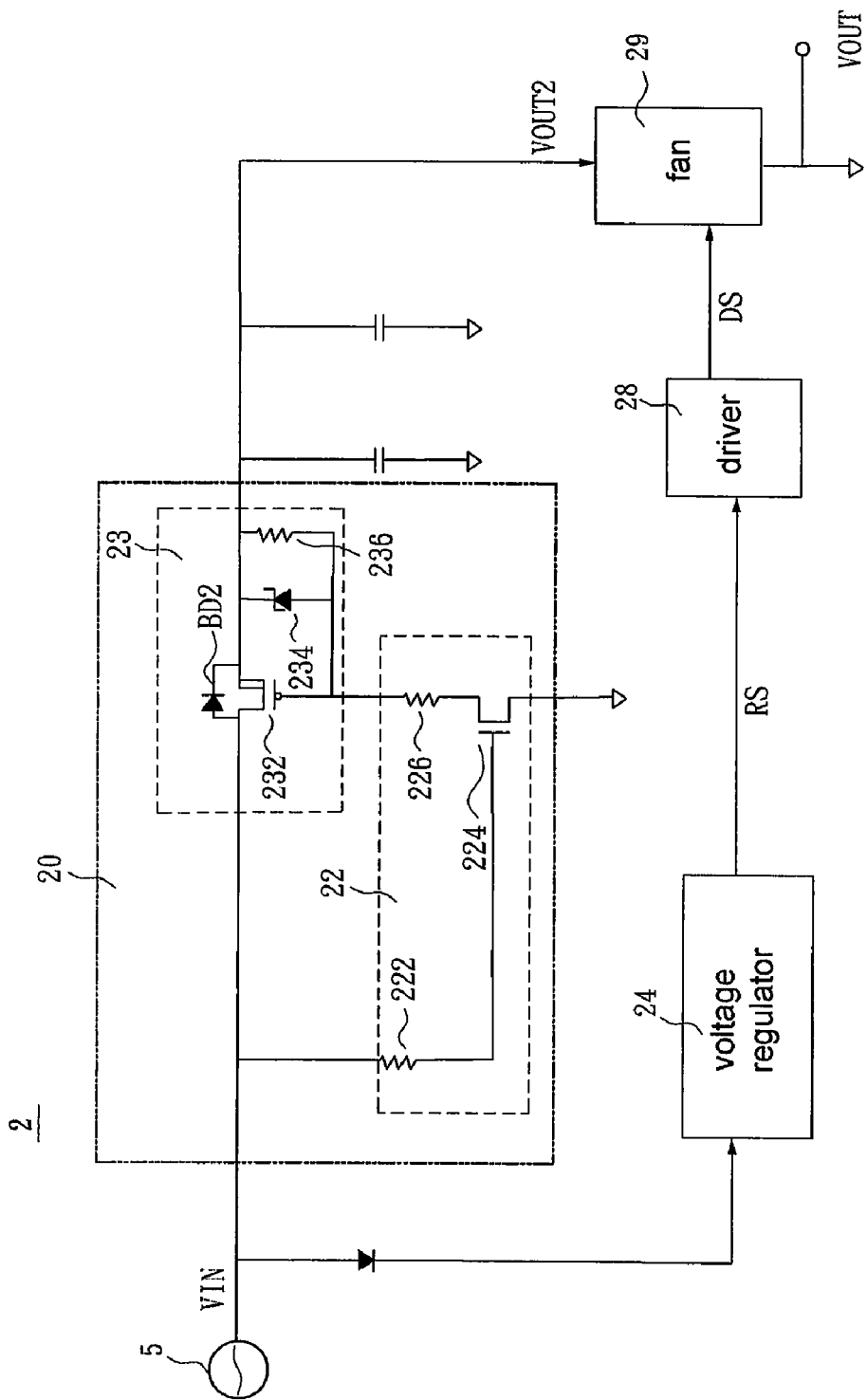
FIG. 3 is a circuit diagram of the fan system in FIG. 2.

With reference to FIGS. 2 and 3, a fan system 2 of a first embodiment of the present invention includes a power reverse protection apparatus 20, a voltage regulator 24, a driver 28, and a fan 29. The voltage regulator 24 is electrically connected to the driver 28 and a power source 5, respectively. The driver 28 is electrically connected to the voltage regulator 24 and the fan 29, respectively. The power reverse protection apparatus 20 is electrically connected to the power source 5 and the fan 29, respectively.

The above power reverse protection apparatus 20 mainly includes a voltage regulator switch 22 and an activating device 23. The power reverse protection apparatus 20 receives an input signal VIN from the power source 5. When the input signal VIN is a high potential signal, the voltage regulator switch 22 is turned on and outputs a first output signal VOUT1. The activating device 23 is electrically connected to the voltage regulator switch 22 and is used to receive the first output signal VOUT1. When the first output signal VOUT1 is a low potential signal, the activating device 23 is activated and outputs a second output signal VOUT2 to the fan 29.

The voltage regulator switch 22 includes a transistor 224, a second resistor 222, and a third resistor 226. The transistor 224 has a first terminal, a second terminal, and a third terminal. The first terminal of the transistor 224 is electrically connected to a first terminal of the third resistor 226. The second terminal of the transistor 224 is grounded and the third terminal of the transistor 224 is electrically connected to a first terminal of the first resistor 222. A second terminal of the first resistor 222 is electrically connected to the power source 5 and the second terminal of the third resistor 226 is electrically connected to the activating device 23.

In the embodiment, the transistor 224 is an N-type metal oxide semiconductor field effect transistor (N-type MOSFET). A first terminal of the N-type MOSFET is a drain (D), a second terminal thereof is a source (S), and a third terminal thereof is a gate (G) which receives the input signal VIN. When the input signal VIN is a high potential signal, the transistor 224 is turned on and outputs a first output signal VOUT1 (a low potential signal or a ground signal) to the activating device 23.

The activating device 23 includes a P-type power element 232, a first zener diode 234, and a first resistor 236. The P-type power element 232 has a first terminal, a second terminal, a third terminal, and a fourth terminal (a body). The first terminal of the P-type power element 232 is electrically connected to the power source 5 for receiving the input signal VIN. The second terminal of the P-type power element 232 is electrically connected to the fan 29. The third terminal of the P-type power element 232 is electrically connected to the second terminal of the third transistor 226 of the voltage regulator switch 22 for receiving the first output signal VOUT1.

Since the fourth terminal (the body) of the P-type power element 232 is formed by an N-type material and the first terminal of the P-type power element 232 is formed by a P-type material, a body diode BD2 can be formed between the first terminal and the second terminal of the P-type power element 232 when the fourth terminal is electrically connected to the second terminal. If the power source 5 is positively connected to the first terminal of the P-type power element 232, the power source 5 can provide an input current from the first terminal of the P-type power element 232 to its second terminal.

Two terminals of the first zener diode 234 are electrically connected to the second terminal and the third terminal of the P-type power element 232, respectively. This is used to limit the voltage (to keep a fixed value of the voltage difference between the second terminal and the third terminal of the P-type power element) to protect the P-type power element 232. Two terminals of the first resistor 236 are electrically connected to the second terminal and the third terminal of the P-type power element 232, respectively, and the first resistor 236 is connected in parallel to the first zener diode 234. Moreover, the P-type power element 232 in the embodiment is a P-type metal oxide semiconductor field effect transistor (P-type MOSFET). A first terminal of the P-type MOSFET is a drain (D), a second terminal thereof is a source (S), a third terminal thereof is a gate (G), and a fourth terminal thereof is a body. The gate (G) receives the first output signal VOUT1 and when it is a low potential signal, the P-type power element 232 is turned on. Alternatively, the first terminal of the P-type power element 232 can be the source (S) and the second terminal of the P-type power element 232 can be the drain (D) in the embodiment.

As described above, when the gate (G) of the transistor 224 receives the input signal VIN as a high voltage signal, the transistor 224 is turned on, so that the third terminal of the P-type power element 232 is grounded through the third resistor 226. The first output signal VOUT1 with a low potential is received from the voltage regulator switch 22 so as to turn on the P-type power element 232. At this time, the body diode BD2 is in a forwardly turned-on state. Thus after the first terminal of the P-type power element 232 receives the input signal VIN (a high potential signal), a second output signal VOUT2 (also a high potential signal) is outputted from the second terminal of the P-type power element 232 to the fan 29. After the above voltage regulator 24 receives the input signal VIN generated by the power source 5, a regulating signal RS is then outputted to the driver 28 according to the input signal VIN, and the driver 28 outputs a driving signal DS to the fan 29 according to the regulating signal RS. At last, the fan 29 is driven and operated according to the driving signal DS and the second output signal VOUT2.

Additionally, if the power source 5 is negatively connected instantly, which means, when the input signal VIN is a low potential or a negative potential signal, the transistor 224 of the voltage regulator switch 22 is turned off. Meanwhile, the gate of the P-type power element 232 obtains a high potential signal and is turned off. At this time, the body diode BD2 can be used as the power reverse protection diode, and thus the P-type power element 232 does not output the second output signal VOUT2 so as to make the fan 29 stop operating.

In addition, since the third terminal of the P-type power element 232 is turned on by receiving the low potential signal, the power consumed by the power reverse protection apparatus 20 is lower than that consumed by the conventional one. Moreover, the power reverse protection apparatus 20 of the present invention does not need a plurality of coils (or inductors) to store a high potential, so that the power reverse protection apparatus 20 and fan system 2 of the present invention can achieve the effects of small size and low cost. Because the circuit structure is rather simple, it is easier for users to control.

Figure 4:
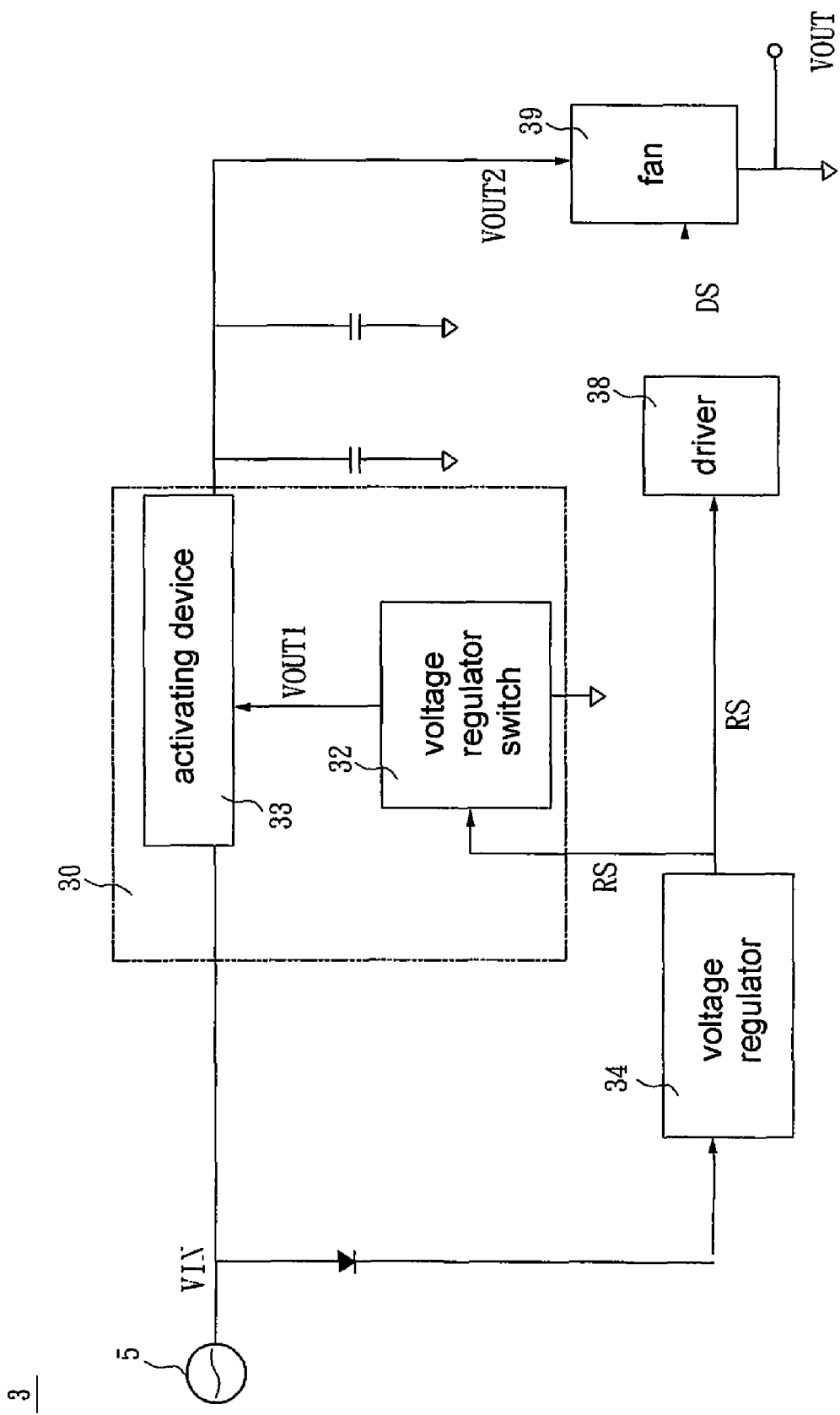
FIG. 4 is a circuit block diagram of a fan system according to a second embodiment of the present invention.
Figure 5:
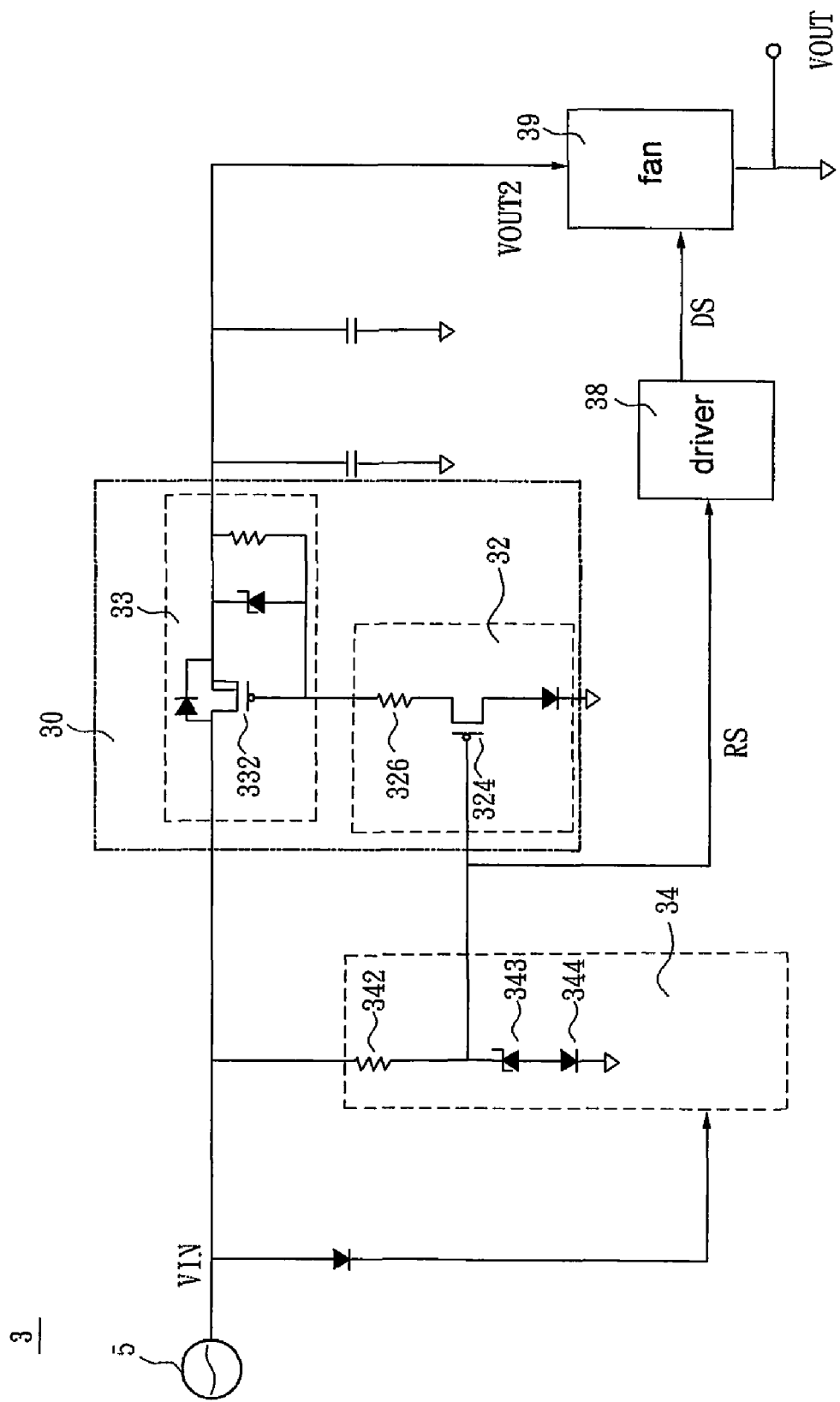
FIG. 5 is a circuit diagram of the fan system in FIG. 4.

With reference to FIGS. 4 and 5, a fan system 3 according to a second embodiment of the present invention includes a power reverse protection apparatus 30, a voltage regulator 34, a driver 38, and a fan 39. The voltage regulator 34 is electrically connected to the power source 5, the driver 38, and the power reverse protection apparatus 30, respectively. The driver 38 is electrically connected to the voltage regulator 34 and the fan 39 respectively. The power reverse protection apparatus 30 is electrically connected the power source 5, the voltage regulator 34, and the fan 39 respectively.

The difference between the second embodiment and the first embodiment is that the voltage regulator switch 32 of the power reverse protection apparatus 30 in the second embodiment is electrically connected to the voltage regulator 34 instead of the power source 5.

The voltage regulator 34 includes a second resistor 342, a second zener diode 343, and a diode 344. A first terminal of the second resistor 342 is connected to a third terminal of the transistor 324. A second terminal of the second resistor 342 is electrically connected to the power source 5. A first terminal of the second zener diode 343 is electrically connected to a common node of the first terminal of the second resistor 342 and the third terminal of the transistor 324. A second terminal of the second zener diode 343 is electrically connected to a first terminal of the diode 344, and a second terminal of the diode 344 is grounded.

The power reverse protection apparatus 30 includes a voltage regulator switch 32 and an activating device 33. The voltage regulator switch 32 includes a transistor 324 and a third resistor 326. The transistor 324 can be a P-type MOSFET, which includes a first terminal (source), a second terminal (drain), and the third terminal (gate). The first terminal of the transistor 324 is electrically connected to a first terminal of the third resistor 326. The second terminal of the transistor 324 is connected to the ground through a diode. The third terminal of the transistor 324 is electrically connected to the common node of the first terminal of the second resistor 342 and the first terminal of the second zener diode 343. A second terminal of the third resistor 326 is electrically connected to the activating device 33. The circuit design of the activating device 33 in the second embodiment is identical to which in the first embodiment, so that the detailed descriptions thereof will be omitted. As for the other elements, please refer to FIG. 5.

The voltage regulator 34 receives the input signal VIN from the power source 5 and outputs a regulating signal RS to the voltage regulator switch 32 of the power reverse protection apparatus 30 according to the input signal VIN. The transistor 324 receives the regulating signal RS and outputs a first output signal VOUT1 (a low potential signal) to turn on the P-type power element 332 according to the regulating signal RS, which is limited by the second zener diode 343 hence is a low potential signal that can merely turn on the first diode 344. The activating device 33 generates a second output signal VOUT2 to the fan 39 according to the regulating signal RS. The way that the activating device 33 generates the second output signal VOUT2 in the second embodiment is identical to that in the first embodiment, so that the detailed descriptions thereof will be omitted.

Lastly, after the voltage regulator 34 receives the input signal VIN, a regulating signal RS is outputted to the driver 38 according to the input signal VIN, and the driver 38 outputs a driving signal DS to the fan 39 according to the regulating signal RS. The fan 39 is driven and operated by the driving signal DS and the second output signal VOUT2.

In addition, since the third terminal of the P-type power element 332 is turned on by receiving the low potential signal, the power consumed by the power reverse protection apparatus 30 is lower than that consumed by the conventional one. Moreover, the power reverse protection apparatus 30 of the present invention does not need a plurality of coils (or inductors) to store a high potential, thus the power reverse protection apparatus 30 and fan system 3 of the present invention can be small-sized and low cost. Because the circuit structure is rather simple, it is easier for users to control.

To sum up, the fan system of the present invention operates a fan according to a driving signal generated by a driver and a second output signal generated by a power reverse protection apparatus. For one thing, the power reverse protection apparatus has the advantages of low power consumption and low material cost, and can be easily controlled. Moreover, since the power reverse protection apparatus includes only a few of electronic elements, the apparatus can be minimized, which fits the trend of the environmental protection and power saving.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A power reverse protection apparatus, electrically connected to a fan and a power source, wherein the power source is electrically connected to a voltage regulator, the voltage regulator is electrically connected to a driver, the driver is electrically connected to the fan, and an input signal generated by the power source is converted to a driving signal by the voltage regulator and the driver, the power reverse protection apparatus comprising:
   a voltage regulator switch receiving the input signal from the power source and outputting a first output signal according to the input signal; and
   an activating device electrically connected to the voltage regulator switch, receiving the input signal and the first output signal respectively, and outputting a second output signal to the fan according to the first output signal;
   wherein the fan operates or stops according to the driving signal and the second output signal,
   wherein the activating device comprises:
   a P-type power element has a first terminal, a second terminal, a third terminal, and a fourth terminal, wherein the first terminal is electrically connected to the power source for receiving the input signal, the second terminal is electrically connected to the fan, the third terminal is electrically connected to the voltage regulator switch for receiving the first output signal, the P-type power element is turned on or turned off according to the first output signal, and the second terminal is electrically connected to the fourth terminal for forming a body diode between the first terminal and the second terminal; and
   a first zener diode has two ends electrically connected to the second terminal and the third terminal of the P-type power element respectively,
   wherein the voltage regulator switch comprises:
   a transistor having a first terminal, a second terminal, and a third terminal, wherein the second terminal of the transistor is grounded;
   a second resistor having a first terminal electrically connected to the third terminal of the transistor and a second terminal electrically connected to the power source; and
   a third resistor having a first terminal electrically connected to the first terminal of the transistor and a second terminal electrically connected to the third terminal of the P-type power element, wherein the third terminal of the transistor receives the input signal and outputs the first output signal to the first terminal of the transistor in accordance with the input signal so as to turn on or turn off the P-type power element.

2. The power reverse protection apparatus according to claim 1, wherein the second output signal is generated according to the input signal.

3. The power reverse protection apparatus according to claim 1, wherein the activating device further comprises a first resistor having two terminals electrically connected to the second terminal and the third terminal of the P-type power element, respectively.

4. The power reverse protection apparatus according to claim 1, wherein the P-type power element is a P-type metal oxide semiconductor field effect transistor (P-type MOSFET), and the first terminal of the P-type MOSFET is a source, the second terminal thereof is a drain, the third terminal thereof is a gate, and the fourth terminal thereof is a body, or wherein the first terminal of the P-type MOSFET is a drain, the second terminal thereof is a source, the third terminal thereof is a gate, and the fourth terminal thereof is a body.

5. The power reverse protection apparatus according to claim 1, wherein the transistor is an N-type MOSFET, and the first terminal of the transistor is a drain, the second terminal thereof is a source, and the third terminal thereof is a gate.

6. A fan system, electrically connected to a power source, the fan system comprising:
   a power reverse protection apparatus electrically connected to the power source, comprising:
   a voltage regulator switch receiving an input signal and outputting a first output signal according to the input signal, and
   an activating device electrically connected to the power source and the voltage regulator switch, receiving the input signal and the first output signal respectively and outputting a second output signal to the fan according to the first output signal;
   a voltage regulator electrically connected to the power source, receiving the input signal from the power source and outputting a regulating signal according to the input signal;
   a driver electrically connected to the voltage regulator, receiving the regulating signal and outputting a driving signal according to the regulating signal; and
   a fan electrically connected to the driver and the power reverse protection apparatus respectively, receiving the driving signal and the second output signal separately, and operating according to the driving signal and the second output signal.

7. A power reverse protection apparatus, electrically connected to a fan, a voltage regulator, and a power source, wherein the power source is electrically connected to the voltage regulator, the voltage regulator is electrically connected to a driver, the driver is electrically connected to the fan, and an input signal generated by the power source is converted to a driving signal by the voltage regulator and the driver, the voltage regulator receives the input signal from the power source and outputs a regulating signal according to the input signal, the power reverse protection apparatus comprising:
   a voltage regulator switch receiving the regulating signal from the voltage regulator and outputting a first output signal according to the regulating signal; and
   an activating device electrically connected to the voltage regulator switch, receiving the input signal and the first output signal respectively, and outputting a second output signal to the fan according to the first output signal;
   wherein the fan operates or stops according to the driving signal and the second output signal.

8. The power reverse protection apparatus according to claim 7, wherein the second output signal is generated according to the input signal.

9. The power reverse protection apparatus according to claim 7, wherein the activating device comprising:
   a P-type power element having a first terminal, a second terminal, a third terminal, and a fourth terminal, wherein the first terminal is electrically connected to the power source for receiving the input signal, the second terminal is electrically connected to the fan, the third terminal is electrically connected to the voltage regulator switch for receiving the first output signal and turning on or turning off the P-type power element according to the first output signal, and the second terminal is electrically connected to the fourth terminal for forming a body diode between the first terminal and the second terminal; and
   a first zener diode having two ends electrically connected to the second terminal and the third terminal of the P-type power element.

10. The power reverse protection apparatus according to claim 9, wherein the activating device further comprises a first resistor having two terminals connected to the second terminal and the third terminal of the P-type power element, respectively.

11. The power reverse protection apparatus according to claim 9, wherein the P-type power element is a P-type MOSFET, and the first terminal of the P-type MOSFET is a source, the second terminal thereof is a drain, the third terminal thereof is a gate, and the fourth terminal thereof is a body, or wherein the first terminal of the P-type MOSFET is a drain, the second terminal thereof is a source, the third terminal thereof is a gate, and the fourth terminal thereof is a body.

12. The power reverse protection apparatus according to claim 9, wherein the voltage regulator switch comprises:
   a transistor having a first terminal, a second terminal, and a third terminal, wherein the second terminal of the transistor is grounded, the third terminal of the transistor receives the regulating signal and outputs the first output signal to the first terminal of the transistor according to the regulating signal so as to turn on or turn off the P-type power element.

13. The power reverse protection apparatus according to claim 12, wherein the voltage regulator switch further comprises a third resistor having a first terminal electrically connected to the first terminal of the transistor and a second terminal electrically connected to the third terminal of the P-type power element, and the voltage regulator comprises a second resistor having a first terminal electrically connected to the third terminal of the transistor and a second terminal electrically connected to the power source, and receiving and outputting the regulating signal to the voltage regulator switch according to the input signal.

14. The power reverse protection apparatus according to claim 13, wherein the voltage regulator further comprises a second zener diode and a diode, a first terminal of the second zener diode is electrically connected to a common node of the first terminal of the second resistor and the third terminal of the transistor, a second terminal of the second zener diode is electrically connected to a first terminal of the diode, and the second terminal of the diode is grounded.

15. The power reverse protection apparatus according to claim 12, wherein the transistor is a P-type MOSFET.

16. The power reverse protection apparatus according to claim 12, wherein the first terminal of the transistor is a source, the second terminal thereof is a drain, and the third terminal thereof is a gate.

17. The power reverse protection apparatus according to claim 15, wherein the first terminal of the transistor is a source, the second terminal thereof is a drain, and the third terminal thereof is a gate.

* * * * *